United States Patent [19]

West

[11] Patent Number: 5,257,024

[45] Date of Patent: Oct. 26, 1993

[54] SEARCH POSITION ENCODER

[75] Inventor: Paul E. West, Glendale, Calif.

[73] Assignee: Quan-Scan, Inc., Pasadena, Calif.

[21] Appl. No.: 482,042

[22] Filed: Feb. 20, 1990

Related U.S. Application Data

[63] Continuation-in-part of Ser. No. 199,008, May 26, 1988, Pat. No. 4,956,817.

[51] Int. Cl.⁵ .................... H03M 1/22; G11C 13/00
[52] U.S. Cl. .......................................... 341/16; 341/5;
341/6; 365/189.01; 365/118
[58] Field of Search ................... 341/16, 1, 5, 6;
365/189.01, 182, 203, 118, 157, 174, 151,
189.09; 369/126; 250/306, 307, 311; 178/18, 19;
310/311, 328

[56] References Cited

U.S. PATENT DOCUMENTS

| | | |
|---|---|---|
| 3,072,543 | 1/1963 | Lubow et al. |
| 3,286,251 | 11/1966 | Byun et al. ............. 341/16 X |
| 3,736,571 | 5/1973 | Cohen et al. ............ 365/174 |
| 3,806,642 | 4/1974 | Veith et al. ............. 178/18 |
| 3,808,364 | 4/1974 | Veith ................... 178/18 |
| 3,959,799 | 5/1976 | Gambino et al. ......... 365/127 X |
| 4,163,168 | 7/1979 | Ishikawa et al. ......... 310/328 |
| 4,227,149 | 10/1980 | Faure et al. ............ 324/158 P |
| 4,343,993 | 8/1982 | Binnig et al. ............ 250/306 |
| 4,535,424 | 8/1985 | Reid ................... 365/51 X |
| 4,575,822 | 3/1986 | Quate ................. 365/174 |
| 4,603,231 | 7/1986 | Reiffel et al. .......... 178/19 |
| 4,709,183 | 11/1987 | Lange ................. 310/328 |
| 4,785,177 | 11/1988 | Besocke ............... 250/306 X |
| 4,829,507 | 5/1989 | Kazan et al. ........... 365/118 X |
| 4,956,817 | 9/1990 | West et al. ............ 365/189.01 |
| 4,962,480 | 10/1990 | Ooumi et al. .......... 365/118 X |

Primary Examiner—Sharon D. Logan
Attorney, Agent, or Firm—Fulwider, Patton, Lee & Utecht

[57] ABSTRACT

The search position encoder includes a generally planar medium, a search probe and a device for moving the probe generally parallel to the surface of the planar medium, and indexing device for locating the actual position of the probe relative to a fixed location on the generally planar medium. A plurality of gratings consisting of alternating strips of conducting and non-conducting materials are arranged on or adjacent to the medium parallel to orthogonal axes of the medium, and a device for sensing the movement of the probe in a plane parallel to the gratings. The location of the probe may then be determined based upon the sensing of the passage of the probe relative to the gratings.

13 Claims, 5 Drawing Sheets

SEARCH POSITION ENCODER

Related Application:

This is a Continuation in Part of Ser. No. 07/199,008 filed May 26, 1988, now U.S. Pat. No. 4,956,817 issued Sep. 11, 1990.

BACKGROUND OF THE INVENTION

1. Field of the Invention

This invention relates to search position encoding, and more specifically relates to search position encoding for ultra high density memories for use with general purpose digital computers.

2. Description of the Related Art

In recent years, the need for increasingly greater capacity data storage devices for computers and related devices has generated a wide variety of high density data storage and retrieval systems. One recent proposal based upon extremely high resolution scanning which is possible with scanning tunneling microscope technology is described in U.S. Pat. No. 4,575,822. Such proposals relying upon the tunneling occurrence present when a stylus is placed within approximately 10 Angstroms of a surface of a dielectric storage medium, have resulted in data storage systems that were not ultimately practical for use in a computer memory system. Severe control and indexing problems developed, since the clearance between the stylus and the storage medium must be maintained to extremely close tolerances, on the order of a few Angstroms, if tunneling currents are to be maintained within reasonable dynamic ranges. However, with the development of extremely high resolution piezoelectric translation devices and extremely accurate drive feedback systems, the maintenance of such extremely close tolerances has become possible. Therefore, a need exists for a search position encoding system, for locating and indexing on a substrate to be scanned by a scanning tunneling microscope stylus. It would be desirable to provide a rapid, random access system for storage and retrieval of data which may be constructed without the use of exotic materials or manufacturing techniques. It would further be desirable if such a system could be operable in air, rather than in a vaccum or another highly controlled environment, which is very often conventionally required for devices using tunneling currents.

SUMMARY OF THE INVENTION

The present invention provides for a search position encoder, suitable for use with a scanning tunnelling microscope scanner, to provide rapid access and accurate indexing of data to be stored or retrieved on a high density digital data storage medium. The invention involves a simple but effective way of indexing the readout system and a memory material construction that provides significant and unexpected benefits over those used in conventional memory systems. The search position encoder includes a generally planar memory medium, a scanning tunnelling probe and means for moving the probe generally parallel to the surface of the planar memory medium, and indexing means for locating the actual position of the probe relative to a fixed location on the generally planar memory medium. A plurality of gratings consisting of alternating strips of conducting and non-conducting materials are arranged on or adjacent to the memory medium parallel to orthogonal axes of the memory medium, and means are provided for sensing the movement of the probe in a plane parallel to the gratings. The location of the probe may then be determined based upon the sensing of the passage of the probe relative to the gratings.

Briefly, and in general terms, a search position encoder according to the invention includes a generally planar plurality of gratings consisting of alternating strips of conducting and non-conducting materials arranged orthogonally and adjacent to a generally planar medium, a search probe capable of movement in a plane parallel to the planar surface of the medium, and spaced apart from the medium, means for moving the probe parallel to the medium, indexing means for locating the actual position of the probe relative to a fixed location on the planar medium, including means for sensing the movement of the probe in plane parallel to the gratings, and for determining the location of the probe based upon the sensing of the passage of the probe relative to the gratings.

The search position encoder comprises a submicron grating of alternating conducting and semi-conducting or non-conducting lines, which may, for example, be formed with gold and silicon, with a spacing of less than or equal to 0.125 microns.

Other aspects and advantages of the invention will become apparent from the following detailed description, and the accompanying drawings, illustrating by way of example the features of the invention.

DETAILED DESCRIPTION OF THE INVENTION

As is shown in the drawings, which are provided for the purpose of illustration, the invention is embodied in a search position encoder apparatus for use in combination with a scanning tunnelling microscope probe to achieve high density data storage and retrieval. The search position encoder is used in conjunction with the movement of the probe in a plane parallel to the surface of a memory material at a distance of from a few Angstroms to a 1,000 Angstroms. Means for indexing are provided in the form of a grating on the surface of the memory medium or adjacent thereto, and an associated sensor for readout thereof, combined with a counter system, to locate the position of the probe on the memory surface. The entire device may be constructed of readily available materials using known construction techniques such that it is unnecessary for the memory system to operate in a vacuum or a highly controlled environment.

The probe in the present invention, which typically is in the form of a protrusion extending from a readout head being moved over an underlying memory surface, can be moved in three dimensions over the surface, and can maintain a substantially constant height above the average height of the underlying surface. Vertical movement to accommodate slopes in the memory surface or changes occurring from variations in temperature may be accommodated in the readout head.

The present invention also employs a means of locating and indexing the readout head relative to a location on the memory surface. Without such a locating and indexing means, the memory itself must be used as a locating system with a subsequent decrease in the reliability of readout of the memory system, since any error in memory location during a readout would not provide a back-up indication of the source of the error. The present invention utilizes a moving sensor associated with each axis of the readout head which scans across a grating located on orthogonal edges of the memory surface or on the memory surface itself. The grating consists of alternating insulating and conducting lines over which a sensor scans. The output of the sensor scanning of the grating is entered into a counter to provide an accurate indication of location relative to an index position for the probe. It has been found that gratings may be constructed which provide a resolution of less than 0.06 microns. This resolution is sufficient to locate relatively small areas of memory from which exact locations of bits may be easily derived.

The present invention typically utilizes an underlying surface such as doped-silicon or any of a variety of other conductive crystaline structural materials upon which is deposited a thin layer of one of a family of materials generally characterized by positions in the periodic table represented by transition metals, post-transition metals, the lanthanide series, the actinide series and certain compounds of these elements. Examples of such materials that have been successful utilized include platinum, gold and paladium.

It has been found that when the probe is placed over a location in the memory material in which data is to be stored in the form of a positive indication that data are present, typically equivalent to the digital form 1, placing a voltage of a sufficient level between the probe and the memory material results in a localized modification of the material characteristics at its surface. This modification takes the form of a physical-chemical transformation in which the underlying substrate of silicon or similar material migrates into the surface of gold or similar material, thereby causing a local alteration in the conductive properties of the memory material.

Thereafter, readout of the digital state of this location is based upon the variation in current present when the probe is moved over this area in the presence of a constant voltage bias between the probe and the memory material.

In practice, the invention operates by causing a perturbation in the memory surface which results in a change in the local resistance to the passage of electrons from the storage material surface to the probe. The probe is then moved in a plane parallel to the surface of the memory material at a distance of a few Angstroms to 1000 Angstroms. Means for indexing in the form of a grating and associated sensor for readout thereof, combined with a counter system, is provided on the surface of the memory medium to thereby locate the position of the probe on the memory surface. The entire device may be constructed of readily available materials using known construction techniques and it is unnecessary for the memory system to operate in a vacuum or a highly controlled environment.

The present invention provides a means of storing enormous quantities of data within a very small area of a memory while still providing a robust and easily fabricated memory storage system that allows random and rapid access to data stored in the memory.

Figure 1:
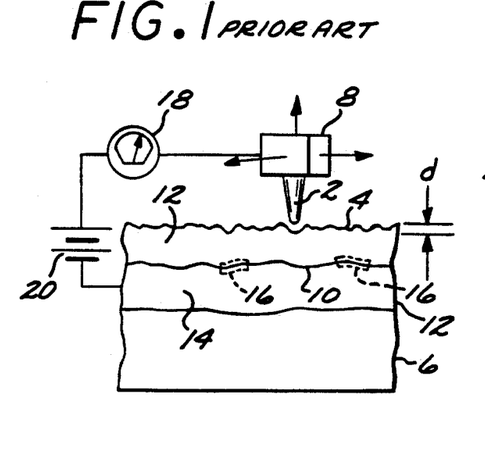
FIG. 1 is an illustration of the prior art illustrating a probe utilizing tunneling currents moving over a semiconductor substrate.

Memory storage devices have been proposed which utilize tunneling currents as a means of reading out perturbations in layers of a substrate located beneath a probe. FIG. 1 illustrates in a diagrammatic fashion the relationship between a probe and an underlying substrate according to the prior art. The probe 2 is positioned a distance d from the upper surface 4 of memory substrate 6 and is moved by means of piezoelectric drives with three degrees of freedom over the surface in order to maintain a distance required to create tunneling emission and cause tunneling currents to flow between substrate 6 and probe 2. This means that probe head 8 must be driven with great accuracy in all three degrees of freedom in order to prevent probe 2 from contacting surface 4, which typically has an RMS roughness on the order of 15A if it is carefully constructed with the best available techniques. Alterations in the surface interface 10 between semiconductor layers 12 and 14 are in the form of charges 16 deposited at those interfaces by activation from an external probe when in a read-in mode. Ammeter 18 provides an indication of tunneling current when a constant voltage from voltage source 20 is applied across tip 2 and memory substrate 6.

Figure 2A:
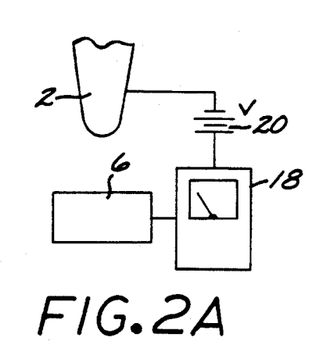
FIGS. 2A-2C illustrate the variation in current as a probe is moved virtually relative to an underlying surface.
Figures 2B, 2C:
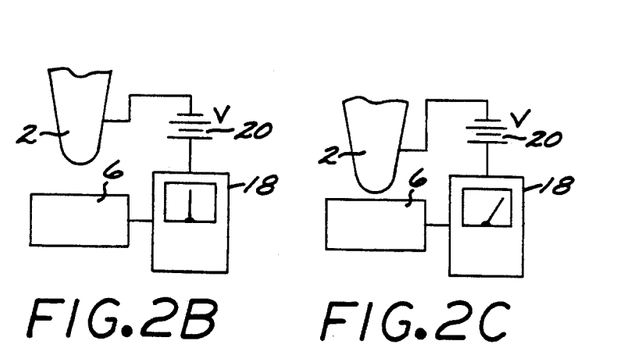

If a probe is moved toward a surface while a constant voltage is applied between the probe and the surface, the current will increase as the probe gets closer to the surface. FIG. 2(c) illustrates how, in the general case, the ammeter 18 indicates an increase in current for a constant voltage from voltage source 20 as probe 2 is moved closer to underlying surface 6. Such an effect occurs as a probe is moved towards a surface, provided that the type of emission remains the same.

Figure 3A:
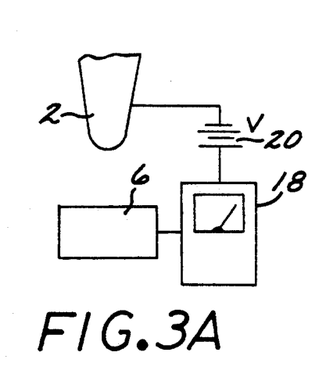
FIGS. 3A-3C illustrate the relationship between Schottky, Field and tunneling emission currents for a constant probe distance.
Figure 3B:
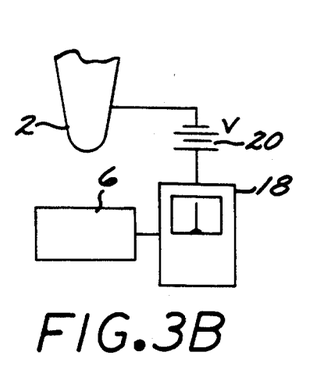
Figure 3C:
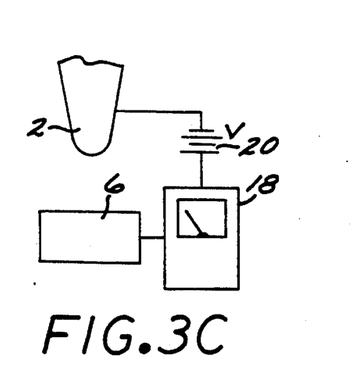

FIG. 3 illustrates that the type of emission does not, however, remain the same for a constant voltage source between the probe and an underlying surface. Depending upon the type of emission for a given distance from the probe, the amount of current which flows may be dramatically different. For instance, in FIG. 3(a) the probe is located approximately 500A from the surface and Schottky emission occurs, with the ammeter indicating that a strong current, on the order of microamps, flows. FIG. 3(b) illustrates a lower current flow which could be expected at the same distance when Field emission occurs and a constant voltage is applied from voltage source 20. FIG. 3(c) illustrates that there is virtually no current flow due to tunneling emission when the probe is positioned 500A from the underlying surface with a constant voltage applied from voltage source 20. Thus, the contribution of these three emission mechanisms to current flow alters dramatically as a function of the distance of the probe from the surface.

Figure 4A:
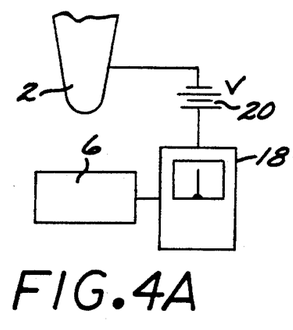
FIGS. 4A-4C illustrate the probe to memory surface distance for a constant current for Schottky, Field and tunneling emission.
Figure 4B:
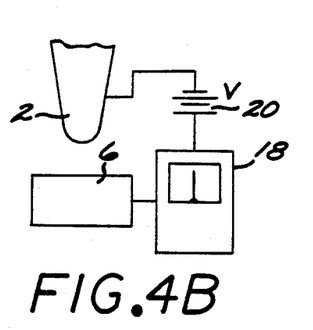
Figure 4C:
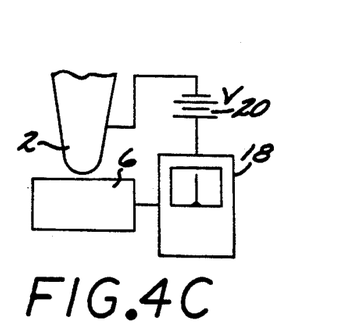

FIG. 4 illustrates that the same currents may be generated from Schottky emissions with the probe located 500A from the surface as shown in 4(a) as is generated from Field emission with the probe located 50A from the surface as illustrated in FIG. 4(b). As shown in FIG. 4(c), an equivalent current may be generated from tunneling emission when the probe is placed 10A from the surface.

Figure 5:
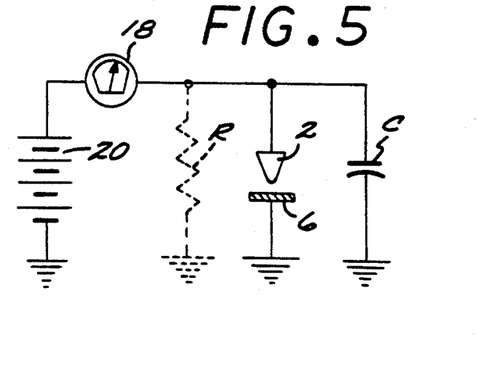
FIG. 5 is a schematic illustration of the effective circuit of a probe in proximity with a surface when a voltage is applied across the probe and surface.

FIG. 5 illustrates a schematic equivalent to a probe 2 in close proximity to an underlying surface 6 of the type discussed above. The proximity of probe 2, the read/write tip-to-surface 6 presents an equivalent resistance R and capacitance C which in the presence of ammeter 18 and voltage source 20 completes an equivalent R-C network. A practical mass storage memory device should have readout times, or equivalent transfer rates, of a single bit of approximately 0.1 microsecond or less. If the capacitance of the read/write tip is typically one picofarad ($1 \times 10^{-12}$ farads), then to achieve a 0.1 microsecond data transfer time, a gap resistance of approximately $10^5$ Ohms is required. Gap resistances of $10^5$ Ohms in a tunneling mode require that the read/write tip must be no greater than 10A from the storage medium. By contrast, in the Schottky emission mode, gap distances as large as 500A are achievable while maintaining a $10^5$ Ohm gap resistance. Thus, in the present invention, the read/write probe may be placed a distance approximately 2 orders of magnitude greater than the surface roughness of the storage medium away and still maintain gap resistances which allow for rapid readout.

Figure 6:
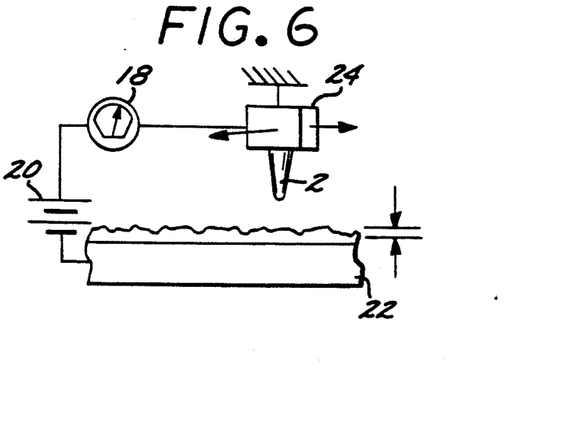
FIG. 6 is an illustration of the relationship between the probe of the present invention and an underlying memory surface with typical roughness as fabricated.

FIG. 6 illustrates a probe 2 and a storage medium 22 of the present invention. As illustrated schematically in this view, ammeter 18 measures the current flowing between probe 2 and memory medium 22 in the presence of a constant voltage from voltage source 20. Read/write head 24 is driven with three degrees of freedom in the preferred tunnelling mode embodiment in order to track the surface roughness of the memory medium and gratings, but may be only driven with two degrees of freedom in a plane parallel to the memory medium, in order to maintain a sufficiently accurate readout when operating in the Schottky or Field emission modes.

Figure 7:
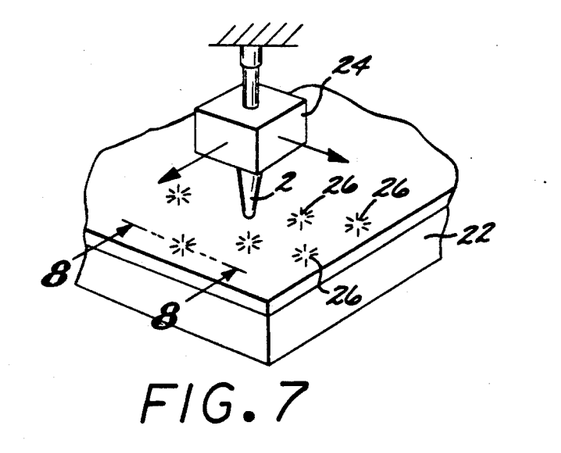
FIG. 7 is a perspective illustration of a probe and memory surface according to the present invention illustrating the placement of binary data in the memory.

FIG. 7 is a perspective view of read/write head 24 carrying read/write probe 2 over memory medium 22 when data have been written into the memory in the form of perturbations 26 representing ones, or an indication of a positive binary state, in the digital format. As illustrated, read/write head 24 is movable in a plane parallel to the surface of memory medium 22.

Figure 8:
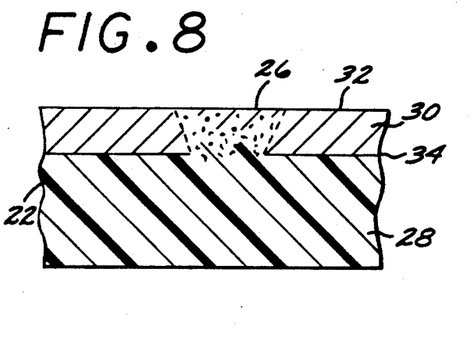
FIG. 8 is an illustration showing the modification of the surface to indicate a positive binary state in the memory.

FIG. 8 illustrates the mechanism by which information is stored in the memory medium 22. Memory medium 22 is preferably constructed of an underlying substrate 28 made of silicon or other suitable semiconductor. And an overlay 30, typically of a dissimilar transition metal such as platinum, gold or paladium, is deposited on substrate 28. When a probe is moved close to surface 32 of overlay 30, and a pulse of approximately 0.1 to 10.0 volt is applied across the gap, a local perturbation of the interface 4 is caused and material from the underlying substrate 28 migrates into and through overlay 30 to cause an area of local altered resistance. When a constant voltage is applied between memory medium 22 and the probe, this locally altered area causes a change in the current flowing across the gap. Thus, in the present mass storage medium a bit is recorded by physicallychemically altering a small area of the surface, thereby causing a change in the electrical properties of the surface. The change in surface characteristic is initiated as described above when large electrical fields and current densities are instituted between a probe and an underlying surface.

Figure 9:
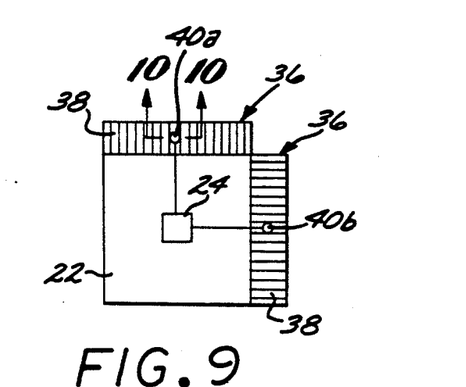
FIG. 9 is an elevational view illustrating the arrangement of indexing means on orthogonal axes of the memory medium.

FIG. 9 illustrates a top view of the read/write head 24 and the orthogonal position encoders 36 of the present invention. In practice encoders 36 consist of gratings 38, formed by alternating conductive strips 42, and semi-conducting or nonconductive strips 39 less than or equal to approximately 0.125 microns apart, over which readout heads 40a, 40b move. This proximity of spacing allows a resolution of less than 0.06 microns to be achievable with a position encoder. Gratings of this quality are normally prepared by achromatic holography, but may also be formed with electron beam lithography or X-ray lithography. Readout heads 40a, b are directly connected to the read/write head 24 and therefore provide the XY position of read/write head 24 with respect to the memory surface 22.

Figure 10:
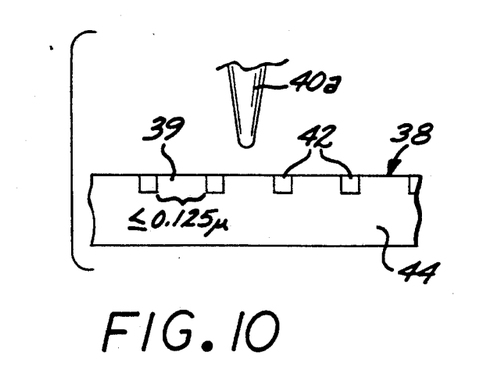
FIG. 10 is a side view, taken at line 10—10 of FIG. 9, illustrating the structure of the gratings and tip for the position encoder of the present invention.

FIG. 10 illustrates the relationship of orthogonally arranged readout heads 40a, 40b over grating 38 adjacent to the memory medium, showing the alternating conductive areas 42 formed in nonconductive silicon material 44 forming the basic structure of grating 38. The readout heads preferably have a free end with an area equal to or less than $10^8$ square angstroms. As readout heads 40a, 40b are moved over grating 38 a variation in resistance is encountered as gold conductive strips 42 are passed and this information, entered into a counter, yields the position of the readout heads 40a, 40b and thus the read/write head 24 in both X and Y dimensions of the memory surface.

Figure 11:
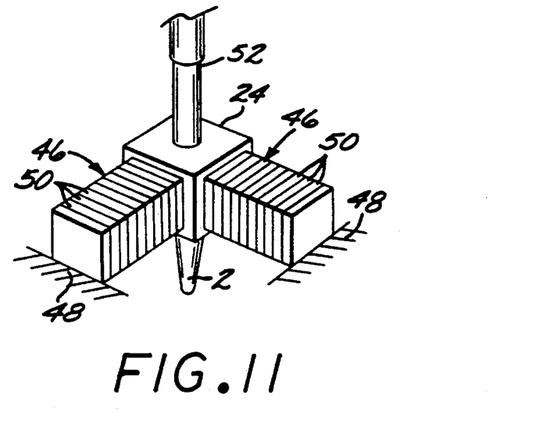
FIG. 11 is an illustration of the piezoelectric horizontal drives of the readout head of the present invention.

FIG. 11 is an illustration of the horizontal orthogonal drives for the read/write head 24. Read/write head 24 is driven, for example, by piezoelectric ceramic stacks 46 situated orthogonally to one another mounted on structure 48. Piezoceramic stacks 46 may be formed of individual piezoelectric ceramic materials 50. Each stack material may be capable of a movement of 0.5 micron in the presence of one volt and thus, a stack of one hundred such piezoceramics will provide movement of 50 microns for one volt applied to each piezoceramic. Thus the piezoceramic stack provides a means of moving read/write head 24 both relatively large distances and small distances with high accuracy by selectively activating the piezoelectric materials in such a stack and/or varying the voltage applied to the elements of the stack. A capacitive drive 52 may be provided in the vertical direction to slightly alter the distance of read/write 2 from memory surface 22 to compensate for alterations in the flatness of the memory surface with changes in temperature or other physical disturbances, but it is unnecessary in the present invention to exactly follow the detailed contour of the surface vertically in order to perform readout of information stored on the surface.

Figure 12:
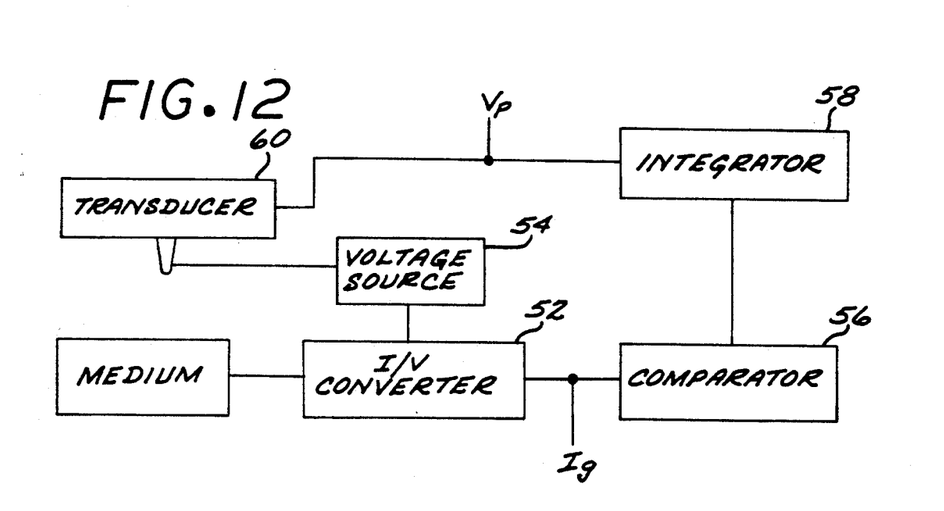
FIG. 12 is a simplified schematic of the readout system for determining the binary state of a location on the memory medium of the present invention.

FIG. 12 illustrates in a schematic fashion the electromechanical feedback system required for the vertical axis if it were desirable to maintain a fixed distance between a probing tip and an underlying memory surface. As shown in the diagram a voltage is output from the I/V converter 52 which is proportional to the tip-to-surface current. The output from the I/V converter 52 is then compared with a reference voltage from voltage source 54 and the difference is integrated 58 after passing through comparator 56. Thus, voltage $V_P$ yields a direct indication of the surface contour, since variation in $V_P$ track variation in the transducer 60 movement required to maintain a fixed tip-to-surface distance.

Figure 13:
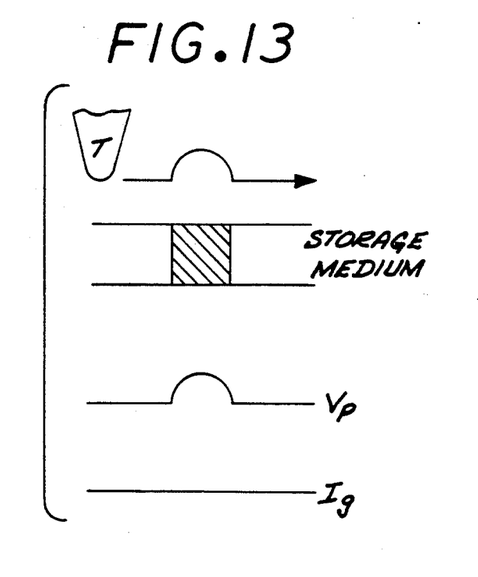
FIG. 13 is an illustration of the mechanism of readout when a tip and constant current are used to detect a perturbation in the storage medium.

FIG. 13 illustrates the mechanisms of the present invention as the tip T is scanned over a local disturbance in a storage medium showing the variation in voltage $V_P$ as the tip is driven to maintain a constant apparent current between the tip and storage medium thereby directing the perturbation of the disturbance representing the stored bit.

Figure 14:
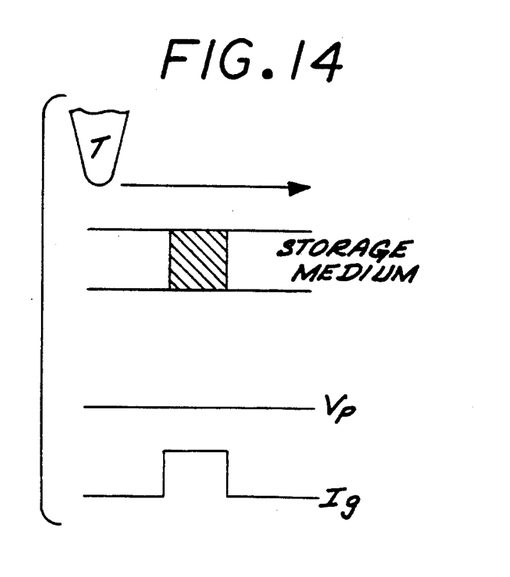
FIG. 14 is an illustration of the mechanism of readout when a tip and constant voltage are used to detect a perturbation in the storage medium.

FIG. 14 illustrates the mechanism of the present invention in which the tip T is passed over an area containing a bit, with the tip scanned at a constant distance from the storage medium, utilizing Schottky or Field effect emission between the storage medium and the tip. As shown in FIG. 14, since there is no error voltage utilized to drive the tip relative to the plane of the storage medium, the output is represented as a change in current $I_g$ read between the storage media and the tip. Thus, scanning a probing tip at high speeds over a flat surface that has local changes in electronic properties can be achieved by reducing the frequency response of the integrator driving the vertical transducer and reading the changes in the tip-to-surface current.

Figure 15:
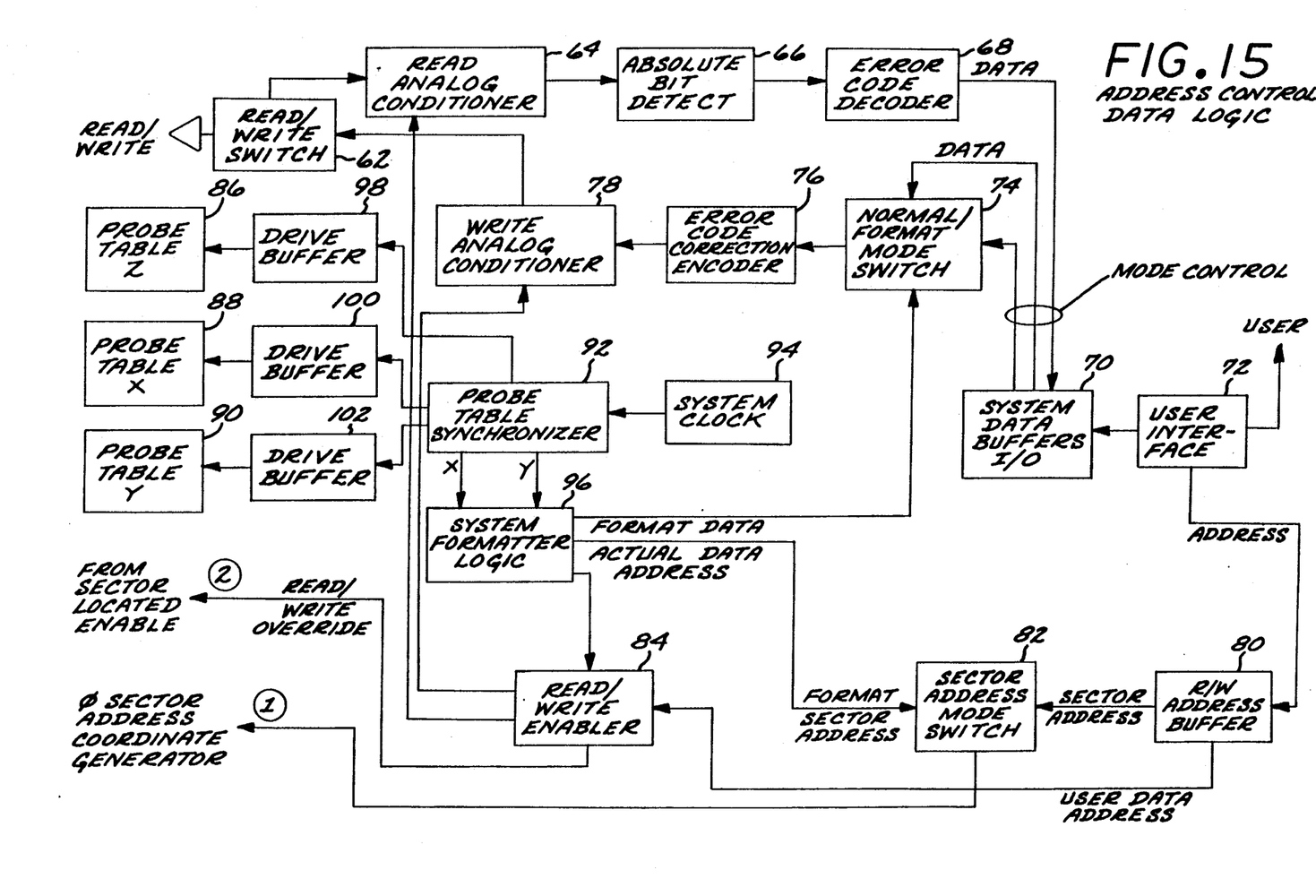
FIG. 15 is a schematic diagram of the address control and data logic of the present invention.

FIG. 15 is a schematic diagram of the address control and data logic for the present invention. Read/write probe 2 is connected to a read/write switch 62 which allows a change between the read and write portions of the control system. In the read mode, the output of the read/write probe and the read/write switch 62 is fed to read analog conditioner 64, the output of which is detected by absolute bit detector 66 and passed to a error code decoder, of the type well known in the art, from which decoded data are output. This stream of digital data is fed to a system data buffer 70 which may be accessed by a user through interface 72. The user may input data through the user interface 72, and system data buffer 70, into the mode switch 74, to pass through error code encoder 76 and a write analog conditioner 78 before the data is entered into read/write switch 62 for the writing of data via the read/write probe into the memory.

When bits are read or written, an address is supplied via user interface 72 to a read/write address buffer 80 which provides a sector address as an output to the sector address mode switch 82. This information is also forwarded to the read/write enabler 84 which controls the read/write functions. The addresses associated with the XYZ coordinates are provided from probe tables for the Z, X and Y coordinates 86, 88 and 90 respectively, which are driven from probe table synchronizer 92 referenced to system clock 94. Information regarding the X and Y coordinates of the read/write probe are provided to system formatter logic function 96 and to drive buffers 98, 100 and 102 from probe table synchronizer 92. Thus the user may select either the reading or writing of data and the read/write probe will move to read or write data at the address input by the user.

Figure 16:
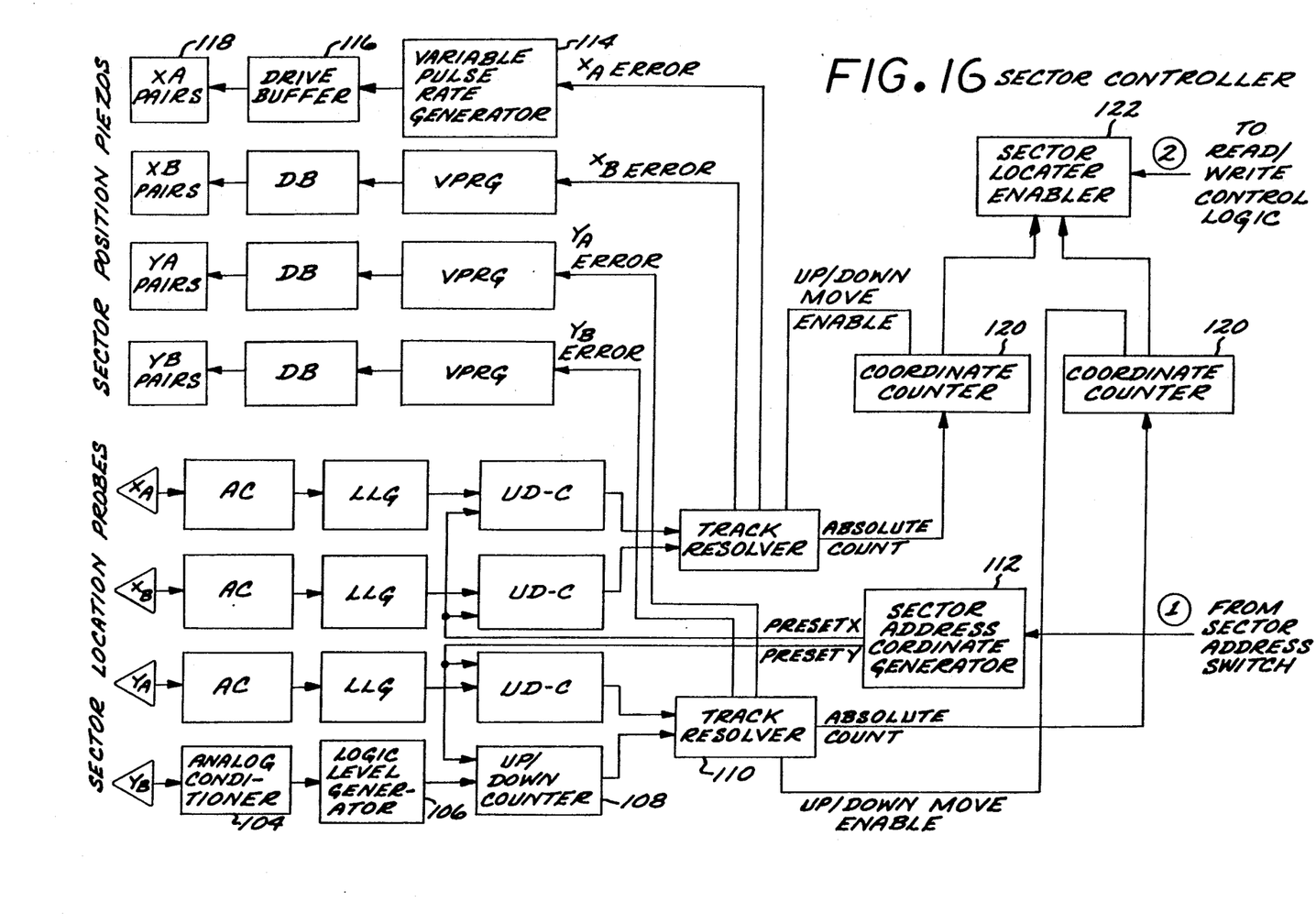
FIG. 16 is a schematic diagram of the sector controller portion of the control system of the present invention.

FIG. 16 is a schematic illustration of a sector controller of the type found to be useful for driving read/write probes to desired locations on the memory surface of the present invention. Sector location read out probes, previously described in FIGS. 9 and 10, provide inputs to analog conditioners 104, logic level generators 106 and up/down counters 108 for resolution into X and Y coordinates by track resolvers 110. The output of track resolvers 110 varies with the sector address coordinator generator 112 and provide error signals to the variable pulse generator 114, drive buffer 116 and piezoelectric pairs 118 to the sector position piezoelectric drivers. The output of track resolvers 110 are then provided to coordinate counters 120 which provide inputs to sector locator enabler 122 and output to the read/write control logic. From the above it may be seen that a precise feedback system to position the read/write probe over the memory surface may be achieved without directly utilizing the information on the storage medium, thus providing important benefits in redundancy and accuracy compared with an approach which relies on the information on the memory medium itself.

It should be understood that the search position encoder of the invention is applicable to generally any planar medium, which need not be a memory medium per se. For example, the search position encoder apparatus may be useful in locating and recording defects in a substrate surface, such as in examination of a material with a scanning, tunnelling microscope, or with a Schottky emission or Field emission probe apparatus.

From the above it will be seen that the present invention provides a substantial improvement in mass storage systems that are to be used in demanding applications and achieves a high data density without high complexity or delicate construction. Furthermore, the invention provides a means of rapidly accessing data and determining the location of the read/write probe independent of the stored data.

While a particular form of the invention has been illustrated and described, it will also be apparent to those skilled in the art that various modifications can be made without departing from the spirit and scope of the invention. Accordingly, it is not intended that the invention be limited except as by the appended claims.

We claim:

1. A search position encoder apparatus having a search probe capable of movement in a plane parallel to a planar medium to be searched, said probe being spaced apart from said medium; and means for moving said probe parallel to a portion of said medium to a predetermined location; said search position encoder apparatus comprising:

indexing means for locating a position of said probe relative to a fixed location on said medium, said indexing means including a plurality of gratings consisting of alternating strips of conductive material and material which is not conductive arranged orthogonally relative to said medium;

means for sensing movement of said probe in a plane parallel to said gratings; and means for reading the location of said probe based upon the sensing of said movement of said search probe relative to said gratings.

2. The encoder apparatus of claim 1, wherein said means for sensing the movement of said search probe comprises first and second indexing probes disposed adjacent said gratings and operatively connected to said search probe for movement across said gratings in relationship to movement of said search probe relative to said medium, and said means for reading the location of said search probe comprises means for counting said gratings across which said indexing probes move in relationship to said movement of said search probe.

3. The encoder apparatus of claim 1, wherein said strips of material which is not conductive are spaced less than or equal to 0.125 microns apart.

4. The encoder apparatus of claim 1, wherein said conductive material comprises gold, and said material which is not conductive comprises silicon.

5. The encoder apparatus of claim 1 wherein said means for moving said search probe parallel to said portion of said medium further comprises a plurality of electromechanical elements arranged parallel to the plane of movement of said search probe, and means to activate said electromechanical elements such that a given control signal produces a predetermined movement of said search probe.

6. The encoder apparatus of claim 5 wherein said electromechanical elements further comprise piezoelectric elements.

7. The encoder apparatus of claim 2 wherein said first and second indexing probes each comprise a tip having a free end with an area not exceeding $10^8$ square angstroms.

8. A search position encoder apparatus having a search probe capable of movement in a plane parallel to a planar medium to be searched, said probe being spaced apart from said medium; and means for moving said probe parallel to a portion of said medium to a predetermined location; said search position encoder apparatus comprising:

indexing means for locating a position of said probe relative to a fixed location on said medium, said indexing means including a plurality of gratings consisting of alternating strips of conductive material and material which is not conductive arranged orthogonally relative to said medium;

first and second indexing probes for sensing movement of said probe in a plane parallel to said gratings, said first and second indexing probes being disposed adjacent said gratings and operatively connected to said search probe for movement across said gratings in relationship to movement of said search probe relative to said medium; and means for reading the location of said probe based upon the sensing of said movement of said search probe relative to said gratings including means for counting said gratings across which said indexing probes move in relationship to said movement of said search probe.

9. The encoder apparatus of claim 8, wherein said strips of material which is not conductive are spaced less than or equal to 0.125 microns apart.

10. The encoder apparatus of claim 8, wherein said conductive material comprises gold, and said material which is not conductive comprises silicon.

11. The encoder apparatus of claim 8 wherein said means for moving said search probe parallel to said portion of said medium further comprises a plurality of electromechanical elements arranged parallel to the plane of movement of said search probe, and means to activate said electromechanical elements such that a given control signal produces a predetermined movement of said search probe.

12. The encoder apparatus of claim 11, wherein said electromechanical elements comprise piezoelectric elements.

13. The encoder apparatus of claim 8, wherein said first and second indexing probes each comprise a tip having a free end with an area not exceeding $10^8$ square angstroms.

* * * * *